United States Patent [19]
Ray

[11] Patent Number: 5,753,375
[45] Date of Patent: May 19, 1998

[54] MICROELECTRONIC DEVICE HAVING DARK MIRROR COATING WITH VIAS THERETHROUGH

[75] Inventor: Michael Ray, Goleta, Calif.

[73] Assignee: Santa Barbara Research Center, Goleta, Calif.

[21] Appl. No.: 369,035

[22] Filed: Jan. 5, 1995

[51] Int. Cl.⁶ .................................................. B32B 15/00
[52] U.S. Cl. ...................... 428/469; 428/472; 428/472.1; 428/472.2; 428/432; 428/433; 428/209; 428/210
[58] Field of Search ........................... 428/469, 472, 428/472.1, 472.2, 432, 433, 209, 210; 257/436, 441, 442, 758, 763, 774, 775, 776, 370.13, 370.08, 338.4, 332; 437/195, 927, 940, 985

[56] References Cited

U.S. PATENT DOCUMENTS

| | | | |
|---|---|---|---|
| 4,282,290 | 8/1981 | Pellicori | 428/472 |
| 4,900,695 | 2/1990 | Takahashi | 437/195 |
| 5,262,352 | 11/1993 | Woo | 437/189 |

OTHER PUBLICATIONS

Tung, T., et al., "State of the Art of Hg–Melt LPE HgCdTe at SBRC", SPIE 1992 International Symposium on Optical Applied Science and Engineering Technical Conference 1735, San Diego CA. Jul. 1992.

*Primary Examiner*—Timothy Speer
*Attorney, Agent, or Firm*—W. C. Schubert; W. K. Denson-Low

[57] ABSTRACT

A microelectronic device includes a substrate device and a dark mirror coating overlying one side of the substrate device. The dark mirror coating has a via therethrough to the substrate device. The dark mirror coating has a plurality of alternating layers of dielectrics and metals. Each metallic layer has an electrically nonconducting region adjacent to the vias, preferably formed by anodizing the metallic layers after deposition.

11 Claims, 2 Drawing Sheets

MICROELECTRONIC DEVICE HAVING DARK MIRROR COATING WITH VIAS THERETHROUGH

BACKGROUND OF THE INVENTION

This invention relates to coatings used on microelectronic optical devices to reduce their reflection of light, and, more particularly, to a dark mirror coating that permits narrow contact vias therethrough.

Microelectronic optical devices are used in a wide variety of applications, one of which is sensing the intensity of light. For example, an infrared detector produces an electrical voltage whose magnitude is related to the intensity of the infrared light incident upon the detector. When this information is properly processed, it may be used to detect the presence of objects emitting infrared energy and provide guidance to their locations.

An infrared detector typically includes a generally planar layer of a photovoltaic material that is responsive to the light wavelength of interest, and electrical contacts to the planar layer to permit sampling of the resulting electrical voltage. Light is incident upon the back side of the detector. The electrical contacts are usually made to the front side of the layer of photovoltaic material, so as not to obscure the field of view from the back side of the device. The front side of the device also often has mesas, recesses, and other features required for other elements of the structure.

A portion of the incident light that enters the back side of the photovoltaic layer passes through the photovoltaic layer and reaches its front side. Some of this light may reflect from the front side itself, the contacts, and the other features found on the front side. It is preferred to minimize any front-side reflections of the incident light.

Dark mirror coatings for reducing the intensity of light reflected from contacts and other features on the front side of a photovoltaic layer are known. Such coatings usually consist of several alternating layers of metals and dielectrics. One type of dark mirror coating is formed of alternating layers of zinc sulfide dielectric material and titanium metal of carefully selected thicknesses. Such dark mirror coatings are generally described, for example, in U.S. Pat. No. 4,282,290.

The front-side electrical contacts penetrate to the photovoltaic layer through vias in the dark mirror coating. Unless care is taken, there can be electrical shorting between the metallic layers of the dark mirror coating through the conductive electrical contact material. One solution is to make the vias quite wide, and to deposit a dielectric coating along the walls of the vias prior to the deposition of the metallic contact material into the vias. The metallic layers of the dark mirror coating are thereby electrically insulated from the metal of the electrical contacts.

While operable, this approach has significant drawbacks in some applications. For example, wherein the detector is defined with a plurality of pixels, it is the common practice to provide a compound via structure having a wide via to accommodate the dielectric insulator material and a narrower via through the insulator material to the photovoltaic material to establish the electrical contact. This arrangement in itself produces new and potentially major sources of reflection into the structure, so that there may be very little net gain in performance with the use of the dark mirror coating. It also adds steps and cost to the manufacturing process.

There is therefore a need for an improved approach to reducing back-side reflection in optical detector and similar types of devices. Desirably, the approach would utilize the principles successfully applied in existing devices, but avoid the problems resulting from internal shorting of the metallic layers in the dark mirror coating without introducing other sources of reflection. The present invention fulfills this need, and further provides related advantages.

SUMMARY OF THE INVENTION

The present invention provides a microelectronic device having a dark mirror coating to reduce reflections, and a method for its preparation. The approach does not require the deposition of a dielectric layer onto the walls of the vias used to establish electrical contact to the photovoltaic layer, and consequently the vias can be made narrow. The present approach requires only a single variation in the fabrication procedure, yet results in a device that is well suited for multi-pixel applications.

In accordance with the invention, a microelectronic device comprises a substrate device having a first side and a dark mirror coating overlying the first side of the substrate device. The dark mirror coating has a via therethrough to the first side of the substrate device. The dark mirror coating comprises a plurality of alternating layers of dielectrics and metals, wherein each metallic layer has an electrically nonconducting region adjacent to the vias. The nonconducting region of each metallic layer is preferably an oxide layer having a structure produced by anodization.

More specifically in a preferred application, a microelectronic device, comprises a light detector substrate device having a first side and a dark mirror coating overlying and contacting the first side of the substrate device. The dark mirror coating comprises a first dielectric layer overlying and contacting the substrate device, a first metallic layer overlying and contacting the first dielectric layer, a second dielectric layer overlying and contacting the first metallic layer, and a second metallic layer overlying and contacting the second dielectric layer. Optionally, a third dielectric layer may overlie and contact the second metallic layer. A via through the dark mirror coating to the first side of the substrate device and an electrical contact to the first side of the substrate device through the via are present. The first metallic layer and the second metallic layer of the dark mirror coating have an anodized region adjacent to the via. In the preferred case where there is no third dielectric layer, the upper surface of the second metallic layer is also normally anodized.

The present approach allows the microelectronic device to be prepared by the conventional processing, except that, after the dark mirror coating and through vias are formed, the front side of the device is made the anode in an anodizing solution. The ends of the metallic layers that are exposed at the vias are oxidized by anodization and thereby rendered electrically nonconducting. (Where there is no third dielectric layer, the top surface of the second metallic layer is also anodized and made electrically nonconducting.) The vias need not be wider than otherwise desired for making the electrical contacts, because no separate overlying dielectric layer is deposited into the vias. The portion of the substrate device exposed through the vias may also be anodized, and, if that occurs, a further step of removing that portion of the anodization (without disturbing the anodization of the metallic layers) is required.

The present invention provides a readily utilized and effective approach for preventing internal shorting between the adjacent layers of the dark mirror coating, without requiring enlargement of the via openings beyond that desired for making the electrical contacts. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
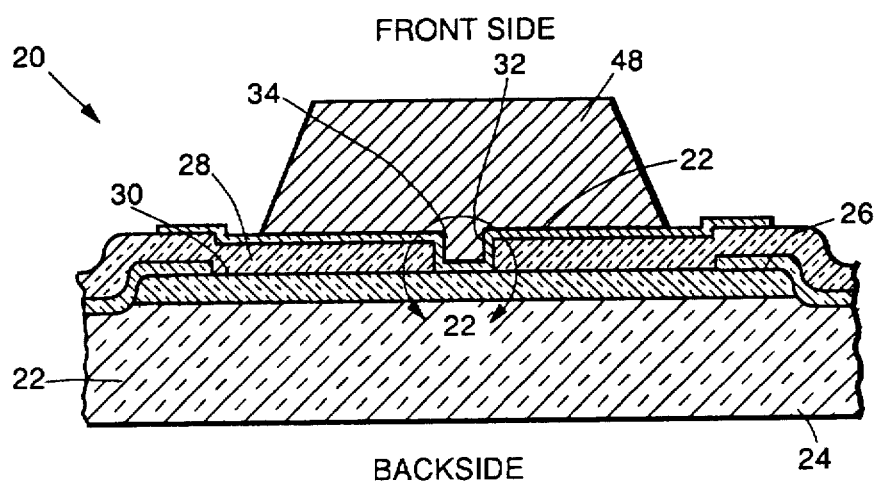
FIG. 1 is a sectional view of a microelectronic device made according to the invention.

FIG. 1 illustrates a microelectronic device 20. The microelectronic device 20 includes a substrate device 22, which in the preferred embodiment is an infrared detector formed of a layer 24 of n-type mercury-cadmium-tellurium and a layer 26 of p-type mercury-cadmium-tellurium deposited thereon. Such detectors are known in the art.

A dark mirror coating 28 is deposited upon a front side 30 of the substrate device 22, over the layer 26. A via 32 penetrates through the dark mirror coating 28. An electrically conductive contact layer 46 is deposited over the dark mirror coating 28, and covers the front side of the dark mirror coating 28 as well as extending into the interior of the via 32 to contact the layer 26. An electrical contact 34 is deposited onto the front side of the contact layer 46, so that electrical contact to the layer 26 is made through the electrical contact 34 and the contact layer 46.

Figure 2A:
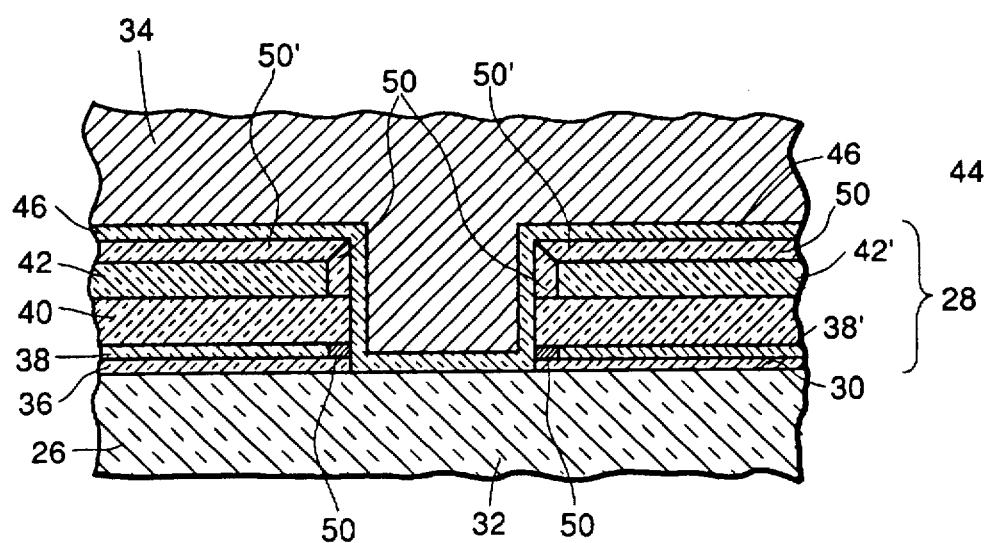
FIG. 2a is a detail of region 2—2 of FIG. 1, showing the region adjacent to a via in an embodiment where there is no third dielectric layer.
Figure 2B:
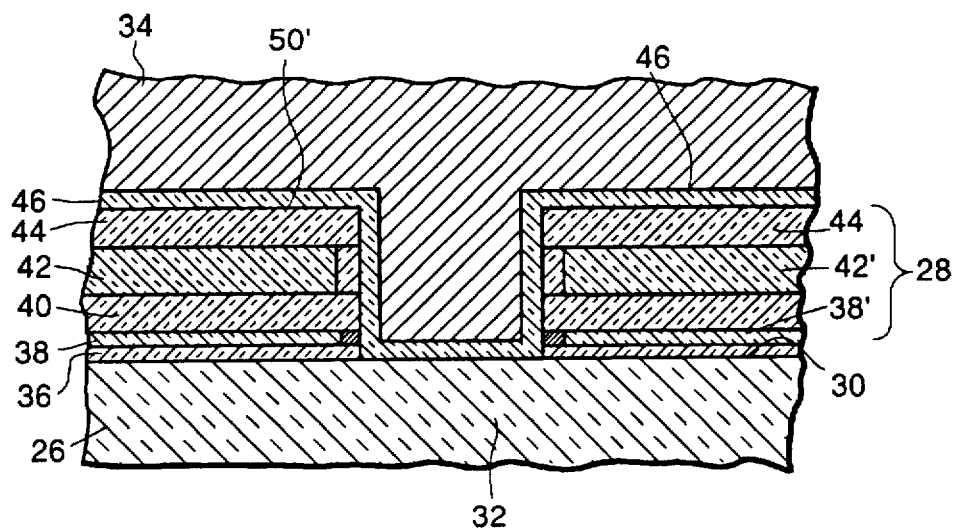
FIG. 2b is a detail of region 2—2 of FIG. 1, showing the region adjacent to a via in an embodiment where this is a third dielectric layer.

FIGS. 2a and 2b each show a detail of the structure of FIG. 1, in the region of the via 32. These two figures illustrate two embodiments which differ only in the absence or presence of a third dielectric layer, as will be discussed in more detail subsequently. The following description applies to both FIG. 2a and FIG. 2b, except where indicated to the contrary.

The dark mirror coating 28 comprises a plurality of alternating layers of dielectric and metallic layers, deposited upon the front side 30 of the substrate device 22. In the preferred case, a first dielectric layer 36 overlies and contacts the front side 30 of the substrate device 22, a first metallic layer 38 overlies and contacts the first dielectric layer 36, a second dielectric layer 40 overlies and contacts the first metallic layer 38, and a second metallic layer 42 overlies and contacts the second dielectric layer 40. Optionally, a third dielectric layer 44 overlies and contacts the second metallic layer 42. FIG. 2a illustrates the embodiment where there is no third dielectric layer 44, and FIG. 2b illustrates the embodiment where there is a third dielectric layer 44.

In these embodiments, the dielectric layers 36, 40, and 44 (where present) are zinc sulfide. The metallic layers 38 and 42 are titanium. The first dielectric layer 36 is about 240 Angstroms thick, the first metallic layer 38 is about 142 Angstroms thick, the second dielectric layer 40 is about 14000 Angstroms thick, the second metallic layer is about 3000 Angstroms thick, and the third dielectric layer 44 (where present) is about 1000 Angstroms thick.

The electrical contact through the via 32 is formed by a thin contact layer 46 that is deposited overlying the dark mirror coating 28 and along the sides and bottom of the via 32. The contact layer 46 is preferably a bimetallic layer of 500 Angstroms of chromium adjacent to the dark mirror coating 28 and 500 Angstroms of nickel overlying the nickel. A mass of indium metal in the form of the electrical contact 34, also sometimes termed a bump 48 when it extends well above the plane of the front side 30, is cold welded to the contact layer 46 to form a suitable external contact for the attachment of leads.

A sensor array (not shown) is formed of a plurality of pixels, each pixel having a sensor element structure like that shown in FIG. 1. In order to avoid shorting between adjacent pixels of the sensor array, it has previously been the practice to deposit a new, thick insulating layer into the via 32 to insulate the ends of the conductive layers 38 and 42. While this approach is operable, it requires that the via be much wider than otherwise would be the case, and also that a second via opening be made through the newly deposited insulating layer to reach the front side 30 of the substrate device 22. This procedure requires oversize vias and additional process steps, and also results in additional reflection line sources in the via area. The present invention provides an alternative approach that overcomes these problems.

Each metallic layer has an electrically nonconducting region adjacent to the via.

In the presently preferred approach, the exposed ends of the metallic layers 38 and 42 are converted to an electrically nonconducting form in a region 50. The nonconducting region 50 insulates the ends of the layers 38 and 42 and prevents any shorting. This technique is quite distinct from applying a complete overlying layer of a dielectric material, which would add new thickness to the exposed ends of all of the layers 36, 38, 40, 42, and 44 (where present) and require that a wider via be initially produced.

The nonconducting region 50 is preferably an oxide of the metal that forms the metallic layer. The oxide is preferably formed by anodization, a technique that is well known and widely applied in other decorative and protective applications. In anodization, the metallic article to be anodized is placed into an oxidizing solution and made the anode of an electrochemical cell. An oxide is formed on the surface of the metal in a thickness much greater than would be achieved under ordinary atmospheric oxidation. Anodization can be controlled very precisely to produce an oxide of a preselected thickness, if desired.

Figure 3:
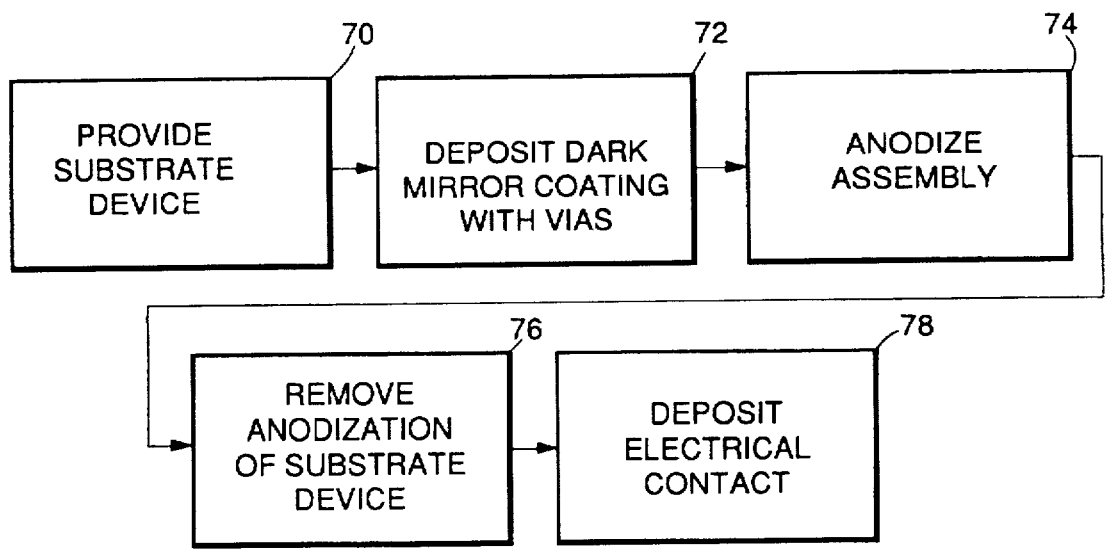
FIG. 3 is a process block diagram for practicing the approach of the invention.

FIG. 3 depicts the method of the invention in block diagram form. A substrate device 22 is provided, numeral 70. In the presently preferred application, the substrate device is a mercury-cadmium-tellurium detector of the type discussed previously. The substrate device 22 is prepared using conventional techniques. Fiducials and mesas are etched, and the sample is passivated using standard procedures.

The dark mirror coating 28 with vias 32 therethrough is deposited, numeral 72. The individual coating layers 36, 38, 40, 42, and optionally 44 are deposited by any operable technique, such as electron beam evaporation, with the compositions and thicknesses discussed previously. The vias can be produced either by placing a mask of resist material on the front side 30 prior to deposition, so that no dark mirror coating is deposited in the mask area, or by depositing a continuous dark mirror coating and thereafter patterning and etching through vias. The first approach is preferred here to produce vias that are about 2 micrometers wide.

After the dark mirror coating 28 with vias 32 is deposited, the exposed portion of the front side 30 of the structure is anodized, numeral 74. For the preferred compositions discussed herein, anodization may be accomplished, for example, by immersing the structure in about 0.1 molar potassium hydroxide solution at a positive voltage applied to the structure of about 30–40 volts. Anodization to produce a thickness of the electrically nonconducting region 50 of about 1000 Angstroms requires about 2 minutes. (The "thickness" in this case is in the horizontal direction in FIG. 2.) The prior discussion relates to a preferred anodization processing, but other operable anodization techniques may also be used.

The result of the anodization step is the electrically insulating titanium oxide (in the preferred case) layer 50 that prevents shorting of the metallic layers 38 and 42. Where there is no third dielectric layer, as in the embodiment of FIG. 2a, the upper surface of the second metallic layer 42 is also anodized to form a titanium oxide coating, layer 50'. This anodization of the upper surface of the second metallic layer 42 is acceptable, as it simply forms an insulating layer over the second metallic layer 42 that is somewhat comparable in function to the third dielectric layer, where present. The layer 50' need not be removed in subsequent processing.

However, in the case of a mercury-cadmium-tellurium device substrate, the anodization step 74 also produces an undesired oxide coating on the mercury-cadmium-tellurium surface of the substrate device 22 at the bottoms of the vias 32. This oxide coating would inhibit or prevent electrical contact to the substrate device 22 through the via 32, if allowed to remain. In this case, the anodization of the exposed portion of the substrate device surface is preferably removed by immersion in a 5 percent aqueous nitric acid solution or in trisodium salt trihydrate, having a formula of $(NaOCOCH_2)N (CH_2COOH)CH_2CH_2N(CH_2COONa)_2 \cdot 3H_2O$, numeral 76. This treatment does not adversely affect the titanium anodization layer 50 (or 50', where present) or any other aspect of the structure.

The electrical contact is deposited, numeral 78. In the preferred approach, the contact layer 46 is deposited by electron beam evaporation. The contact layer 46 extends into the bottoms of the vias 32, as well as other areas. The electrical contact is completed by cold welding indium metal to form the electrical contact 34 (typically in the form of the bump 48).

The invention has been reduced to practice according to the preferred embodiment set forth herein.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelectronic device, comprising:

a light detector substrate device having a first side;

a dark mirror coating overlying the first side of the substrate device, the dark mirror coating having a via therethrough to the first side of the substrate device, the dark mirror coating comprising a plurality of alternating layers of dielectrics and metals, wherein the plurality of alternating layers includes at least two layers of metals and a dielectric layer therebetween, wherein each layer of metal has an electrically nonconducting region adjacent to the via, and wherein none of the electrically nonconducting regions lie between a dielectric layer and the via; and an electrical contact extending through the via to the first side of the light detector substrate device.

2. The microelectronic device of claim 1, wherein the substrate device is a mercury-cadmium-tellurium light detector.

3. The microelectronic device of claim 1, wherein the dark mirror coating comprises a first dielectric layer overlying and contacting the substrate device, a first metallic layer overlying and contacting the first dielectric layer, a second dielectric layer overlying and contacting the first metallic layer, and a second metallic layer overlying and contacting the second dielectric layer.

4. The microelectronic device of claim 3, further including a third dielectric layer overlying and contacting the second metallic layer.

5. The microelectronic device of claim 3, further including an anodized region at an upper surface of the second metallic layer remote from the second dielectric layer.

6. The microelectronic device of claim 1, wherein the electrically nonconducting region comprises an oxide of the metal that forms the layer.

7. The microelectronic device of claim 1, wherein the electrically nonconducting region comprises an anodized region.

8. A microelectronic device, comprising:

a light detector substrate device having a first side;

a dark mirror coating overlying and contacting the first side of the substrate device, the dark mirror coating comprising a first dielectric layer overlying and contacting the substrate device, a first metallic layer overlying and contacting the first dielectric layer, a second dielectric layer overlying and contacting the first metallic layer, and a second metallic layer overlying and contacting the second dielectric layer;

a via through the dark mirror coating to the first side of the substrate device; and an electrical contact to the first side of the substrate device through the via, wherein the first metallic layer and the second metallic layer of the dark mirror coating have an anodized region adjacent to the via.

9. The microelectronic device of claim 8, wherein the substrate device is a mercury-cadmium-tellurium light detector.

10. The microelectronic device of claim 8, further including a plurality of vias through the dark mirror coating, and wherein the first metallic layer and the second metallic layer of the dark mirror coating have an anodized region adjacent to each of the vias.

11. The microelectronic device of claim 8, further including an anodized region at an upper surface of the second metallic layer remote from the second dielectric layer.

* * * * *